(12) United States Patent
Kher et al.

(10) Patent No.: US 7,871,942 B2
(45) Date of Patent: Jan. 18, 2011

(54) METHODS FOR MANUFACTURING HIGH DIELECTRIC CONSTANT FILM

(75) Inventors: Shreyas S. Kher, Campbell, CA (US); Pravin K. Narwankar, Sunnyvale, CA (US); Khaled Z. Ahmed, Anaheim, CA (US); Yi Ma, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/057,113

(22) Filed: Mar. 27, 2008

(65) Prior Publication Data

US 2009/0246972 A1   Oct. 1, 2009

(51) Int. Cl.
*H01L 21/31* (2006.01)
*H01L 21/469* (2006.01)

(52) U.S. Cl. ............ 438/785; 438/786; 257/E21.625; 427/255.19; 427/255.31

(58) Field of Classification Search ........... 438/785, 438/786, 240; 257/E21.267, E21.625, E21.639; 427/255.18, 255.19, 255.27, 255.28, 255.31
See application file for complete search history.

(56) References Cited

U.S. PATENT DOCUMENTS

| | | | |
|---|---|---|---|
| 6,450,116 B1 | 9/2002 | Noble et al. | |
| 6,548,368 B1 | 4/2003 | Narwankar et al. | |
| 6,660,659 B1 | 12/2003 | Kraus et al. | |
| 6,831,021 B2 | 12/2004 | Chua | |
| 6,858,547 B2 | 2/2005 | Metzner et al. | |
| 6,986,834 B2 | 1/2006 | Irumata et al. | |
| 7,067,439 B2 | 6/2006 | Metzner et al. | |
| 7,179,754 B2 | 2/2007 | Kraus et al. | |
| 2002/0142500 A1* | 10/2002 | Foglietti et al. | 438/22 |
| 2003/0101938 A1 | 6/2003 | Ronsse et al. | |
| 2005/0235905 A1 | 10/2005 | Senzaki et al. | |
| 2005/0260357 A1 | 11/2005 | Olsen et al. | |
| 2005/0271812 A1* | 12/2005 | Myo et al. | 427/248.1 |
| 2005/0271813 A1 | 12/2005 | Kher et al. | |
| 2006/0062910 A1* | 3/2006 | Meiere | 427/226 |
| 2006/0062917 A1* | 3/2006 | Muthukrishnan et al. | 427/248.1 |
| 2006/0153995 A1 | 7/2006 | Narwankar et al. | |
| 2006/0193979 A1 | 8/2006 | Meiere et al. | |
| 2006/0264067 A1 | 11/2006 | Kher et al. | |
| 2007/0020890 A1 | 1/2007 | Thakur et al. | |
| 2007/0049053 A1 | 3/2007 | Mahajani | |
| 2007/0093012 A1 | 4/2007 | Chua et al. | |
| 2007/0099438 A1 | 5/2007 | Ye et al. | |
| 2007/0111458 A1 | 5/2007 | Sato et al. | |
| 2007/0141856 A1 | 6/2007 | Sato et al. | |
| 2009/0226341 A1* | 9/2009 | Shindo | 420/423 |

OTHER PUBLICATIONS

Fachman, Christian, et al, "Tuning the dielectric properties of hafnium silicate films", Feb. 2007, Microelectronic Engineering, vol. 84, pp. 2883-2887.*

(Continued)

*Primary Examiner*—Matthew C Landau
*Assistant Examiner*—Joseph C Nicely
(74) *Attorney, Agent, or Firm*—Diehl Servilla, LLC

(57) ABSTRACT

Processes for making a high K (dielectric constant) film using an ultra-high purity hafnium containing organometallic compound are disclosed. Also described are devices incorporating high K films made with high purity hafnium containing organometallic compounds.

18 Claims, 2 Drawing Sheets

OTHER PUBLICATIONS

Wilk, G. D., et al., "High-k gate dielectrics: Current status and materials properties considerations", *Journal of Applied Physics*, vol. 89, No. 10, (May 31, 2001), pp. 5243-5275.

PCT International Search Report, PCT/US2009/038402, dated Jan. 18, 2010, 7 pgs.

PCT Written Opinion, PCT/US2009/038402, dated Jan. 18, 2010, 4 pgs.

Kim, Jaehyun et al., "Conformal growth and characterization of hafnuim silicate thin film by MOCVD using HTB and TDEAS", *J. mater. Sci: Mater. Electron.*, vol. 18, No. 4, Abstract only, (Apr. 2007), 1 pgs.

H. Kato, T. et al., "Effect of post-nitriding on electrical properties of high-permittivity hafnium and zirconium silicate films", *Proceedings of the 7th International Conference on Properties and Applications of Dielectric Materials* (2003), 765-768 pgs.

Kim, Jaehyun et al., "Characterization of hafnium silicate thin films grown by MOCVD using a new combination of precursors", *Journal of Crystal Growth 263* (2004), Abstract only,(2004), 2 pgs.

\* cited by examiner

METHODS FOR MANUFACTURING HIGH DIELECTRIC CONSTANT FILM

BACKGROUND OF THE INVENTION

Embodiments of the present invention generally relate to methods to deposit materials on substrates and, more specifically, to methods for depositing hafnium metal oxides, metal nitrides, metal oxynitrides, metal silicates and metal silicon oxynitrides using atomic layer deposition or chemical vapor deposition processes.

Microelectronic devices are fabricated on a semiconductor substrate as integrated circuits in which various conductive layers are interconnected with one another to permit electronic signals to propagate within the device. An example of such a device is a complementary metal-oxide-semiconductor (CMOS) field effect transistor (FET) or MOSFET.

Over the past decades, the MOSFET has continually been scaled down in size and modern integrated circuits are incorporating MOSFETs with channel lengths of less than 0.1 micron. Devices with a 65 nm feature size (with the channel being even shorter) are currently in production. The decrease in feature size has resulted in certain challenges because small MOSFETs exhibit higher leakage currents, and lower output resistance than larger devices. Still, smaller MOSFETs are desirable for several reasons. The main reason to make transistors smaller is to pack more and more devices in a given chip area, reducing the price per chip. Additionally, the reduction in transistor dimension can help increase the speed.

Because of small MOSFET geometries, the voltage that can be applied to the gate must be reduced to maintain reliability. To maintain performance, the threshold voltage of the MOSFET has to be reduced as well. As threshold voltage is reduced, the transistor cannot be switched from complete turn-off to complete turn-on with the limited voltage swing available. Subthreshold leakage, which was ignored in the past, now can have a significant impact on device performance.

A gate electrode is part of an integrated circuit. For example, a CMOS transistor comprises a gate structure disposed between source and drain regions that are formed in the semiconductor substrate. The gate structure generally comprises a gate electrode and a gate dielectric. The gate electrode is disposed over the gate dielectric to control a flow of charge carriers in a channel region that is formed between drain and source regions beneath the gate dielectric. The gate dielectric typically comprises a thin material layer having a dielectric constant of about 4.0 or greater (for example, gate oxides such as silicon dioxide ($SiO_2$), silicon oxynitride (SiON), and the like). As the gate length of silicon CMOS devices is scaled to less than 100 nm, new high dielectric constant (K) materials will likely replace silicon oxide. In addition, metal gates will likely replace polycrystalline silicon (polysilicon) gates. For example, in some CMOS transistors, the gate electrode may be formed from at least one of a metal (e.g., titanium (Ti), tantalum (Ta), tungsten (W), and the like) and metal-containing conductive compound (e.g., titanium nitride (TiN), tantalum nitride (TaN), tungsten nitride (WN), and the like). Replacement of polysilicon as a traditional material of the gate electrode with metals and metal-containing compounds reduces undesired voltage drops associated with the polysilicon depletion effect, as well as increases drive current performance and the operational speed of the CMOS transistor.

The gate oxide, which serves as insulator between the gate and channel, should be made as thin as possible to increase the channel conductivity and performance when the transistor is on and to reduce subthreshold leakage when the transistor is off. However, with current gate oxides with a thickness of around 1.2 nm (which in silicon is ~5 atoms thick) the quantum mechanical phenomenon of electron tunneling occurs between the gate and channel, leading to increased power consumption.

Insulators (referred to as high-k dielectrics) that have a larger dielectric constant than silicon dioxide, such as group IVb metal silicates, for example, hafnium and zirconium silicates and oxides are being used to reduce the gate leakage. Increasing the dielectric constant of the gate dielectric allows a thicker layer while maintaining a high capacitance. (Capacitance is proportional to dielectric constant and inversely proportional to dielectric thickness.) Generally, a higher dielectric thickness reduces the quantum tunneling current through the dielectric between the gate and the channel. However, the difference in conduction band energy between the semiconductor and the dielectric (and the corresponding difference in valence band energy) impacts leakage current level. For the traditional gate oxide, silicon dioxide, the former barrier is approximately 8 eV. For many alternative dielectrics, the value is significantly lower, tending to increase the tunneling current, somewhat negating the advantage of higher dielectric constant.

As mentioned above, alternative materials have been proposed for use as gate dielectric materials, in particular hafnium-containing materials such as hafnium dioxide ($HfO_2$), and hafnium-containing silicate ($Hf_xSi_yO$). Although improvements to semiconductor gate electrodes have been made through the use of alternative gate metals and gate dielectric materials, further improvements are desired to improve the performance of integrated circuit devices, for example, to reduce leakage current density.

SUMMARY

Embodiments of the invention are directed toward methods for producing a high K (dielectric constant) dielectric hafnium-containing silicate film. The method comprises the reaction, in a processing chamber, of an ultra-high purity hafnium-containing organometallic compound. The organometallic compound has substantially no metal impurities. A post-deposition annealing process is performed on the substrate. Nitrogen atoms are incorporated into the hafnium-containing film and a post-nitridation annealing of the substrate is performed. In one or more embodiments, the films are part of a MOSFET structure.

As used in this specification and the appended claims, the term "ultra-high purity" means that the compound is at least about 99.995% pure. The term "substantially no metal impurities" means that metals other than hafnium may be present in the ultra-high purity organometallic compound at a total concentration of less than about 500 ppm. In specific embodiments, the concentration of metal impurities is less than about 250 ppm, less than about 100 ppm or less than about 50 ppm. In other specific embodiments, the metal impurities comprise less than about 250 ppm zirconium, less than about 100 ppm zirconium or less than about 50 ppm zirconium. In further detailed embodiments, the metal impurities comprise less than about 1 ppm lead, less than about 0.5 ppm lead, less than about 0.2 ppm lead and less than about 0.1 ppm lead. Other specific embodiments have the metal impurities comprising sodium with a concentration less than about 0.15 ppm, less than about 0.1 ppm or less than about 0.05 ppm. Additional specific embodiments have the metal impurities comprising aluminum with a concentration less than about 3 ppm, less than about 2 ppm or less than about 1 ppm.

Generally, commercially available (standard purity) tetrakisdiethyl-aminohafnium (TDEAH) exhibits a zirconium content in the range of 400 to 3000 parts per million. It has been determined that decreasing the amount of zirconium impurities inherent in the organometallic compound to levels below about 50 ppm has a surprisingly large effect on resultant semiconductor capacitors incorporating the high K films.

In some detailed embodiments, the hafnium-containing organometallic compound is tetrakisdiethylaminohafnium. In other detailed embodiments, the hafnium-containing silicate film has a thickness in the range of about 10 and about 100 angstroms. Detailed embodiments have the thickness in the range of about 20 and about 50 angstroms. More detailed embodiments have the thickness at about 30 angstroms.

Further embodiments also include a pre-cleaning of a silicon wafer. The pre-cleaning is performed prior to the formation of a film on the substrate. The pre-cleaning is performed by soaking the wafer in a solution of hydrofluoric acid. After soaking, the residual HF is rinsed from the silicon wafer and the wafer is dried. Detailed embodiments use a 1:100 solution of HF in water, with a soak time of about two minutes.

According to one or more embodiments, the film is processed by chemical vapor deposition or by atomic layer deposition. In other detailed embodiments, the conditions employed for the deposition of the high K dielectric film include a temperature in the range of about 600° C. and about 700° C., and a pressure in the range of about 4 to about 6 torr for the ultra-high purity hafnium containing organometallic compound.

Post-deposition annealing may occur at a temperature of about 500° C. to about 650° C. for about four minutes. The pressure within the processing chamber may be about 25 to about 45 torr of gas containing ambient ratios of nitrogen and oxygen.

The nitridation process may be a decoupled plasma nitridation occurring at about 900 watts for about three minutes. The nitridation may be performed in an argon/nitrogen plasma processing chamber, where the processing chamber pressure is in the range of about 5 to about 15 millitorr. Detailed embodiments have the chamber pressure at about 10 millitorr. In one or more embodiments, the film has about 10% to about 25% nitrogen incorporated into the film. Further detailed embodiments have the about 17%. nitrogen incorporated into the film.

The post-nitridation annealing may occur at about 900° C. to about 1100° C. for less than about one minute. Other detailed embodiments have the post-nitridation annealing occurring at about 1000° C. In more detailed embodiments, the annealing is performed for about 30 seconds. The annealing may occur in an environment which contains less than 0.1% oxygen.

Further embodiments of the invention are directed to MOSFETS incorporating metal oxide semiconductor capacitor including a high K film made with an ultra-high purity hafnium containing organometallic compound. The MOSFET exhibits a leakage current density less than about 50% of the leakage current density exhibited by a MOSFET incorporating a metal oxide semiconductor capacitor having a high K film formed using a standard purity compound at an operating voltage of about −0.4.

Detailed embodiments of a device exhibit a leakage current density less than $10^{-4}$ A/cm$^2$ at an operating voltage in the range of about −0.5 to about +0.5 volts. Other embodiments exhibit a leakage current density less than about $5 \times 10^{-5}$ A/cm$^2$ at an operating voltage in the range of about −0.5 to about +0.5 volts. Further MOSFET embodiments exhibit a leakage current density less than about $10^{-5}$ A/cm$^2$ at an operating voltage in the range of about −0.4 about +0.5 volts. The leakage current density of MOSFETS according to other embodiments at an operating voltage of about −0.4 volts is less than about $10^{-5}$ A/cm$^2$.

DETAILED DESCRIPTION OF THE INVENTION

Before describing several exemplary embodiments of the invention, it is to be understood that the invention is not limited to the details of construction or process steps set forth in the following description. The invention is capable of other embodiments and of being practiced or being carried out in various ways.

As used in this specification and the appended claims, the singular forms "a", "an" and "the" include plural referents unless the context clearly indicates otherwise. Thus, for example, reference to "a compound" includes a combination of two or more compounds, and the like.

One aspect of the present invention relates to methods for manufacturing high K dielectric films, which may be utilized in the manufacture of MOSFETS and other devices incorporating high K dielectric films. Another aspect of the invention relates to articles of manufacture including, but not limited to, high K dielectric films and devices that include high K dielectric films.

Figure 1:
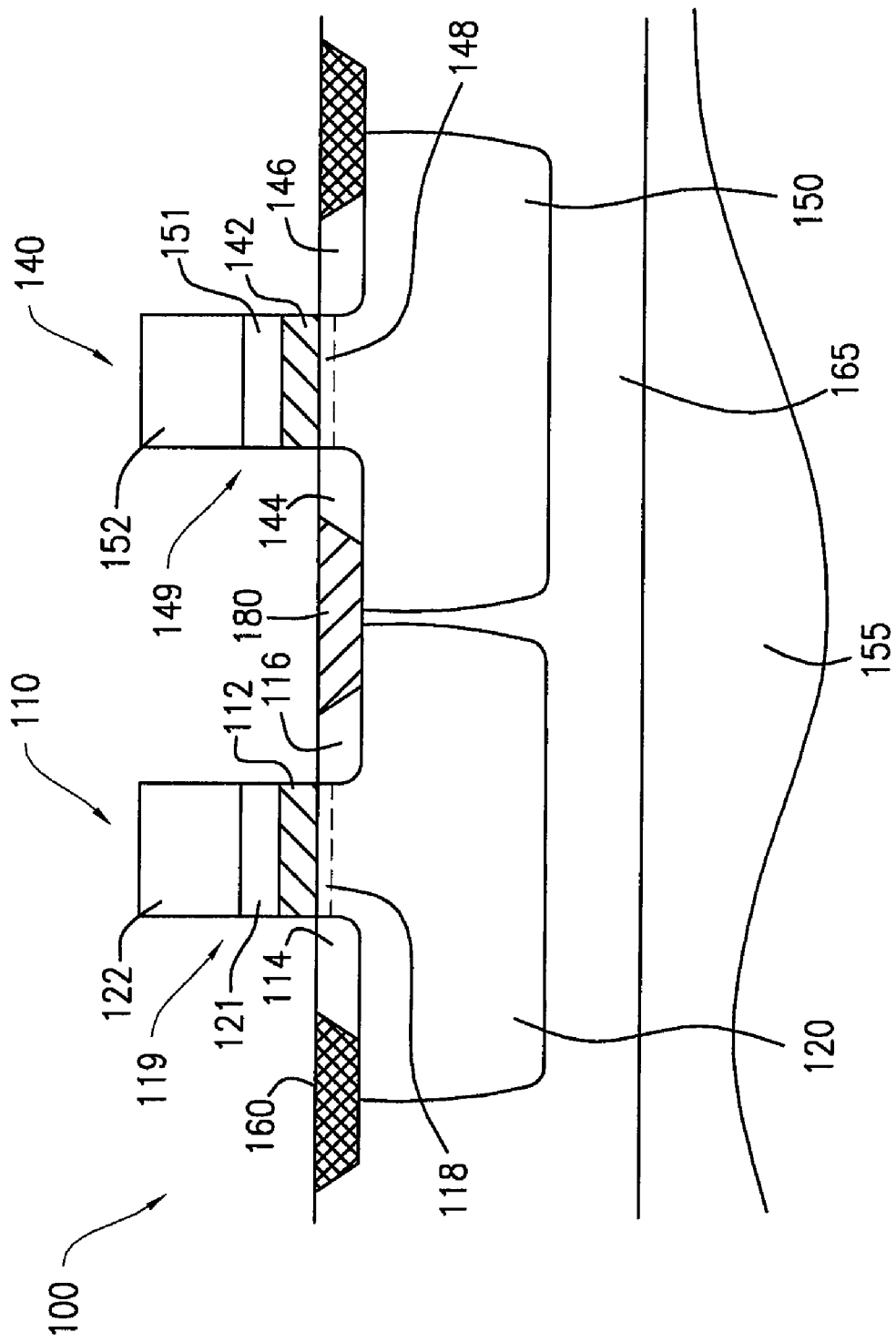
FIG. 1 is a cross-sectional view of a field effect transistor pair.

One or more embodiments of the present invention provide methods that are particularly useful in forming complementary metal oxide semiconductor (CMOS) integrated-circuit devices and will be described in that context. Other devices and applications are also within the scope of the invention. FIG. 1 illustrates portions of a cross sectional view of a FET pair in a typical CMOS device. The FET pair shown comprises an NMOS FET and a PMOS FET, but it will be understood that the CMOS device can comprise additional FETs, and include FETs having the same conductivity type. Device 100 comprises a silicon wafer 155 doped with a p-type material, a p-type epitaxial silicon layer 165 on wafer 155, a p-type well region 120 and an n-type well region 150 defined in epitaxial layer 165, an n-type transistor (NMOS FET) 110 defined in p-well 120 and a p-type transistor (PMOS FET) 140 defined in n-well 150. Region 180 electrically isolates NMOS 110 and PMOS 140 transistors and region 160 electrically isolates the pair of transistors 110 and 140 from other semiconductor devices on substrate 155.

According to one or more embodiments of the invention, NMOS transistor 110 comprises a gate region 119, source region 114 and a drain region 116. The gate region 119 includes a first metal region 121 and a second metal region 122. The source and drain regions are n-type regions on opposite sides of the gate region 119. Channel region 118 is interposed between source region 114 and drain region 116. A gate dielectric layer 112 separates channel region 118 and first metal region 121. Gate dielectric layer 112 electrically insulates first metal region 121 from channel region 118. The gate dielectric layer 112, the first metal region 121 and second metal region 122 together may be referred to herein as a gate stack. The gate dielectric region 112 according to one or more embodiments is a high K dielectric hafnium-containing material such as HfO2. The first metal region 121 comprises a conductor material, typically a metal such as tantalum nitride (TaN), which is may formed by atomic layer deposition (ALD). The second metal region 122 comprises a metal, for example, tantalum, which may be formed by any suitable process such as PVD. When an appropriate voltage is applied between p-type silicon wafer 155 and gate region 122, electrons from p-well 120 move into region 118 directly below dielectric layer 112 thereby creating an n-type channel 118. A voltage applied between source 114 and drain 116 causes current to flow between source 114 and drain 116.

According to one or more embodiments, PMOS transistor 140 comprises a gate region 149, a source region 144 and a drain region 146. The gate region 149 includes a first metal region 151 and a second metal region 152. The source and drain regions are p-type regions on opposite sides of gate region 149. Channel region 148 is interposed between source region 144 and drain region 146. A gate dielectric 142 separates channel region 148 and first metal region 151. Dielectric 142 electrically insulates first metal region 151 from channel region 148. The gate dielectric layer 142, the first metal region 151 and second metal region 152 together may be referred to herein as a gate stack. Suitable gate materials include nitride materials such as, but not limited to, TiN and TaN.

Figure 2:
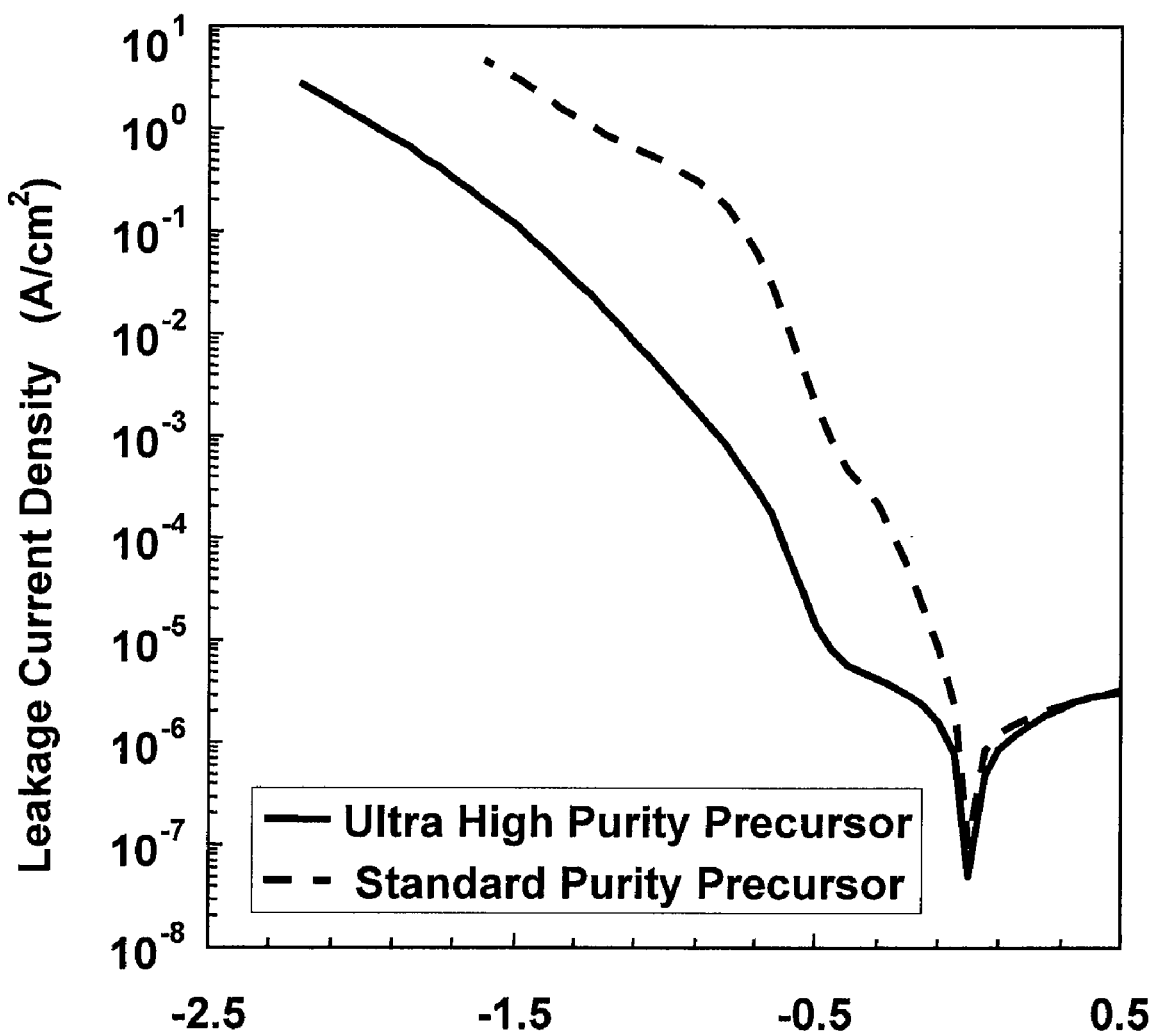
FIG. 2 shows a graph of leakage current density as a function of the applied potential for a device incorporating a high K film made in accordance with an embodiment of the invention.

FIG. 2 illustrates the effect of the precursor purity on the leakage current density. The lower level impurities demonstrated a marked effect on the leakage current density.

In one or more embodiments, the first metal region 151 comprises a metal, typically TaN. The second metal region 152 comprises a metal, for example, tantalum. When an appropriate voltage is applied between p-type silicon wafer 155 and gate region 149, holes from n-well 150 move into region 148 directly below dielectric layer 142 thereby creating a p-type channel 148. A voltage applied between source 144 and drain 146 causes current to flow between source 144 and drain 146.

MOS device design is a complicated process. For example, in the design of MOSFETs, improvements made by maximizing drive current results in increased leakage current. Conversely, an improvement such as decreased leakage current negatively impacts the drive current.

Embodiments of the invention described herein involve the formation of hafnium-containing films on substrates. Examples of substrates include, but are not limited to, semiconductor wafers, such as crystalline silicon (e.g., Si<100> or Si<111>), silicon oxide, silicon germanium, doped or undoped polysilicon, doped or undoped silicon wafers silicon nitride and patterned or non-patterned wafers.

Surfaces include bare silicon wafers, films, layers and materials with dielectric, conductive and barrier properties and include aluminum oxide and polysilicon. Pretreatment of surfaces includes polishing, etching, reduction, oxidation, hydroxylation, annealing and baking.

A substrate can be pretreated to be terminated with a variety of functional groups such as hydroxyls (OH), alkoxy (OR, where R=Me, Et, Pr or Bu), haloxyls (OX, where X=F, Cl, Br or I), halides (F, Cl, Br or I), oxygen radicals, aminos (NH or $NH_2$) and amidos (NR or $NR_2$, where R=Me, Et, Pr or Bu). A pretreatment can be accomplished by administering a reagent, such as $NH_3$, $B_2H_6$, $SiH_4$, $SiH_6$, $H_2O$, HF, HCl, $O_2$, $O_3$, $H_2O_2$, $H_2$, atomic-H, atomic-N atomic-O, alcohols or amines.

Many industrial applications exist for the product compounds synthesized by the various embodiments of the invention. Within the microelectronics industry, the product compounds are used as high-k transistor gate dielectric materials, transistor gate interface engineering, high-k capacitor dielectric materials (DRAMs), seed layers, diffusion barrier layers, adhesion layers, insulator layers, conducting layers and functionalized surface groups for patterned surfaces (e.g., selective deposition).

Many precursors are within the scope of the invention. Precursors may be a plasma, gas, liquid or solid at ambient temperature and pressure. However, within the ALD chamber, precursors are volatilized. Organometallic compounds or complexes include any chemical containing a metal and at least one organic group, such as alkyls, alkoxyls, alkylamidos and anilides. Precursors can be comprised of organometallic and Inorganic/halide compounds Exemplary hafnium precursors include hafnium compounds containing ligands such as alkylamidos, cyclopentadienyls, halides, alkyls, alkoxides and combinations thereof. Alkylamido hafnium compounds used as hafnium precursors include $(RR'N)_4Hf$, where R or R' are independently hydrogen, methyl, ethyl, propyl or butyl. Specific hafnium precursors include: $(Et_2N)_4Hf$, $(Me_2N)_4Hf$, $(EtMeN)_4Hf$, $(t-BuC_5H_4)_2HfCl_2$, $(C_5H_5)_2HfCl_2$, $(EtC_5H_4)_2HfCl_2$, $(Me_5C_5)_2HfCl_2$, $(Me_5C_5)HfCl_3$, $(i-PrC_5H_4)_2HfCl_2$, $(i-PrC_5H_4)HfCl_3$, $(t-BuC_5H_4)_2HfMe_2$, $(acac)_4Hf$, $(hfac)_4Hf$, $(tfac)_4Hf$, $(thd)_4Hf$, $Br_4Hf$, $Cl_4Hf$, $I_4Hf$, $(NO_3)_4Hf$, $(t-BuO)_4Hf$, $(i-PrO)_4Hf$, $(EtO)_4Hf$ and $(MeO)_4Hf$.

Exemplary silicon precursors include: alkylamidosilanes (e.g., $(Me_2N)_4Si$, $(Me_2N)_3SiH$, $(Me_2N)_2SiH_2$, $(Me_2N)SiH_3$, $(Et_2N)_4Si$, $(Et_2N)_3SiH$), $Si(NCO)_4$, $MeSi(NCO)_3$, $SiH_4$, $Si_2H_6$, $SiCl_4$, $Si_2Cl_6$, $MeSiCl_3$, $HSiCl_3$, $Me_2SiCl_2$, $H_2SiCl_2$, silanols (e.g., $MeSi(OH)_3$, $Me_2Si(OH)_2$), $(EtO)_4Si$ and various alkoxy silanes (e.g., $(RO)_{4-n}SiL_n$, where R=methyl, ethyl, propyl and butyl and L=H, OH, F, Cl, Br or I and mixtures thereof). Also, higher silanes are used as silicon precursors by processes of the invention.

Exemplary oxygen precursors include: $H_2O$, $H_2O_2$, $O_3$, $O_2$, NO, $N_2O$, $NO_2$, $N_2O_5$, alcohols (e.g., ROH, where R=Me, Et, Pr and Bu), peroxides (organic and inorganic) carboxylic acids and radical oxygen compounds (e.g., O, $O_2$, $O_3$ and OH radicals). Radical oxygen compounds can be produced by heat, hot-wires and/or plasma.

The processes of the invention can be carried out in equipment known in the art of ALD, CVD, etc. The apparatus brings the sources into contact with a heated substrate on which the films are grown. Hardware that can be used to deposit films is an ALD apparatus as disclosed in U.S. patent application Ser. No. 10/251,715, filed Sep. 20, 2002, assigned to Applied Material, Inc., Santa Clara, Calif. and entitled "An Apparatus for the Deposition of High K dielectric Constant Films," published as United States Application Publication No. 2003/0101938 A1, and is incorporated herein by reference in entirety for the purpose of describing the apparatus. Carrier gases or purge gases include $N_2$, Ar, He, $H_2$, forming gas and mixtures thereof.

The ALD processes are maintained in a temperature range from about 20° C. to about 650° C. However, materials grown may be similar throughout a wider temperature range assuming that saturating ALD behavior is maintained. The ALD processes are conducted with a pressure in the range from about 0.1 Torr to about 100 Torr. Although, materials grown may be similar from high vacuum to high pressures assuming saturating ALD behavior is maintained. Carrier gas (e.g., $N_2$) is maintained in the range from about 50 sccm to about 1,000 sccm, but higher speeds may create particle transport issues while lower speeds could allow particle formation due to inefficient purging, thus affecting electrical behavior of thin films. Films are deposited with thickness in the range from about 2 Å to about 1,000 Å. Detailed embodiments have thicknesses in the range of about 5 Å to about 100 Å, and more detailed embodiments in the range from about 10 Å to about 50 Å.

Accordingly, one or more embodiments of the invention are directed toward methods for producing a high K dielectric hafnium-containing silicate film. The method comprises the decomposition, in a processing chamber, of an ultra-high purity hafnium-containing organometallic compound. The organometallic compound has substantially no metal impurities. A post-deposition annealing process is performed on the substrate. Nitrogen atoms are incorporated into the hafnium-containing film and a post-nitridation annealing of the substrate is performed.

As used in this specification and the appended claims, the term "ultra-high purity" means that the compound is at least about 99.995% pure. The term "substantially no metal impurities" means that metals other than hafnium may be present in the ultra-high purity organometallic compound at a total concentration of less than about 500 ppm. In specific embodiments, the concentration of metal impurities is less than about 250 ppm, less than about 100 ppm or less than about 50 ppm. In other specific embodiments, the metal impurities comprise less than about 250 ppm zirconium, less than about 100 ppm zirconium or less than about 50 ppm zirconium. In further detailed embodiments, the metal impurities comprise less than about 1 ppm lead, less than about 0.5 ppm lead, less than about 0.2 ppm lead and less than about 0.1 ppm lead. Other specific embodiments have the metal impurities comprising sodium with a concentration less than about 0.15 ppm, less than about 0.1 ppm or less than about 0.05 ppm. Additional specific embodiments have the metal impurities comprising aluminum with a concentration less than about 3 ppm, less than about 2 ppm or less than about 1 ppm.

In some detailed embodiments, the hafnium-containing organometallic compound is tetrakisdiethylaminohafnium. In other detailed embodiments, the hafnium-containing silicate film has a thickness in the range of about 10 and about 100 angstroms. Detailed embodiments of films have the thickness in the range of about 20 and about 50 angstroms. More detailed embodiments of films have the thickness at about 30 angstroms.

Further embodiments also include pre-cleaning of a silicon wafer. The pre-cleaning is performed prior to the formation of a film on the substrate. The pre-cleaning is performed by soaking the wafer in a solution of hydrofluoric acid. After soaking, the residual HF is rinsed from the silicon wafer and the wafer is dried. Detailed embodiments use a 1:100 solution of HF in water, with a soak time of about two minutes.

According to various embodiments, the film is processed by chemical vapor deposition or by atomic layer deposition. In other detailed embodiments, the conditions employed for the deposition of the high K dielectric film include a temperature in the range of about 600° C. and about 700° C., at a pressure of about 4 to about 6 torr of the ultra-high purity hafnium containing organometallic compound.

Post-deposition annealing may be performed at a temperature of about 500° C. to about 650° C. for about four minutes. The pressure within the processing chamber may be in the range of about 25 to about 45 torr of gas containing ambient ratios of nitrogen and oxygen.

The nitridation process may be in a decoupled plasma nitridation apparatus performed at about 900 watts for about three minutes. The nitridation may be performed utilizing an argon/nitrogen plasma, where the processing chamber pressure is about 5 to about 15 millitorr. Detailed embodiments have the chamber pressure at about 10 millitorr. Other detailed embodiments have about 10% to about 25% nitrogen incorporated into the film. Further detailed embodiments have about 17% nitrogen incorporated into the film.

The post-nitridation annealing may occur at about 900° C. to about 1100° C. for less than about one minute. Other detailed embodiments have the post-nitridation annealing occurring at about 1000° C. In more detailed embodiments, the annealing occurs for about 30 seconds. The annealing may occur in an environment which contains less than 0.1% oxygen.

Further embodiments of the invention relate to MOSFETS incorporating metal oxide semiconductor capacitors processed having a high K film made with an ultra-high purity hafnium containing organometallic compound. The device incorporating a high K film according to one or more embodiments exhibits a leakage current density less than about 50% of the leakage current density exhibited by a device incorporating a metal oxide semiconductor capacitor having a high K film made using a standard purity compound when a voltage of about −0.4 volts is applied to the device having a polysilicon electrode.

Detailed embodiments of a device incorporating high K films exhibit a leakage current density less than $10^{-4}$ A/cm$^2$ at an operating voltage in the range of about −0.5 to about +0.5. Other embodiments of devices incorporating high K films exhibit a leakage current density less than about $5 \times 10^{-5}$ A/cm$^2$ at an operating voltage in the range of about −0.5 to about +0.5 volts. Further embodiments of devices incorporating high K films exhibit a leakage current density in the range of less than $10^{-5}$ A/cm$^2$ at an operating voltage in the range of about −0.4 about +0.5 volts. In other embodiments of devices incorporating high films, the leakage current density at an operating voltage of about −0.4 volts is less than about $10^{-5}$ A/cm$^2$.

Reference throughout this specification to "one embodiment," "certain embodiments," "one or more embodiments," "an embodiment," a the like, means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

While the foregoing is directed to embodiments of the present invention, other and further embodiments of the invention may be devised without departing from the basic scope thereof, and the scope thereof is determined by the claims that follow.

The invention claimed is:

1. A method for forming a high K dielectric hafnium-containing silicate film in a MOSFET comprising:
   reacting an ultra-high purity hafnium containing organometallic compound in a processing chamber to form the hafnium-containing silicate film on a substrate, the hafnium containing organometallic compound comprising less than about 250 ppm zirconium, less than about 1 ppm lead, less than about 0.15 ppm sodium and less than about 3 ppm aluminum;
   performing a post-deposition annealing of the substrate at a temperature in the range of about 500° C. to about 650° C.;
   incorporating nitrogen into the film; and
   performing a post-nitridation annealing of the substrate, the film exhibiting a leakage current density less than about $10^{-4}$ A/cm$^2$ at an operating voltage in a range of about −0.5 to about +0.5 volts.

2. The method of claim 1, wherein the hafnium containing organometallic compound is tetrakisdiethylaminohafnium.

3. The method of claim 1, wherein the hafnium-containing silicate film has a thickness in the range of about 20 angstroms and about 50 angstroms.

4. The method of claim 1, wherein the hafnium-containing silicate film has a thickness of about 30 angstroms.

5. The method of claim 1, further comprising:

prior to forming the film on the substrate, pre-cleaning the substrate by soaking the substrate in a solution of hydrofluoric acid, rinsing the substrate and drying.

6. The method of claim 1, wherein the film exhibits a leakage current density less than about $10^{-5}$ A/cm$^2$ for an operating voltage of about −0.4 volts.

7. The method of claim 1, wherein the film is processed by chemical vapor deposition.

8. The method of claim 1, wherein the film is processed by atomic layer deposition.

9. The method of claim 1, further comprising pre-cleaning the substrate using a 1:100 HF:H$_2$O solution for about two minutes.

10. The method of claim 1, wherein deposition of a thickness of a high K dielectric constant film takes place at about 600° C. to about 700° C., with a pressure of about 4 to about 6 torr of the ultra-high purity hafnium containing organometallic compound.

11. The method of claim 10, wherein the high K dielectric constant film is about 20 to about 50 angstroms.

12. The method of claim 10, wherein the high K dielectric constant film is about 30 angstroms thick.

13. The method of claim 1, wherein the post-deposition annealing occurs for about four minutes with a pressure of about 25 to about 45 torr of gas containing ambient ratios of nitrogen and oxygen.

14. The method of claim 1, wherein the nitridation is a decoupled plasma nitridation at about 800 to about 1000 watts for about two to about four minutes in an argon/nitrogen plasma, the argon/nitrogen gas present at a pressure of about 5 to about 15 millitorr.

15. The method of claim 14, wherein about 10% to about 25% nitrogen is incorporated into the film.

16. The method of claim 14, wherein about 17% nitrogen is incorporated into the film.

17. The method of claim 1, wherein the post-nitridation annealing occurs at about 900° C. to about 1100° C. for less than about one minute in an environment containing less than about 0.1% oxygen.

18. The method of claim 1, wherein the metal impurities comprise less than about 50 ppm zirconium.

* * * * *